(12) United States Patent
Umekita et al.

(10) Patent No.: US 7,394,143 B2
(45) Date of Patent: Jul. 1, 2008

(54) SEMICONDUCTOR INTEGRATED CIRCUIT DEVICE

(75) Inventors: Satoshi Umekita, Tokyo (JP); Tomomi Ajioka, Tokyo (JP); Kenji Hirose, Tokyo (JP); Yoshihiko Yasu, Tokyo (JP); Yujiro Miyairi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/652,013

(22) Filed: Jan. 11, 2007

(65) Prior Publication Data

US 2007/0210404 A1 Sep. 13, 2007

(30) Foreign Application Priority Data

Mar. 13, 2006 (JP) ............................. 2006-066850

(51) Int. Cl.
*H01L 29/00* (2006.01)
(52) U.S. Cl. ..................................... 257/499; 257/544
(58) Field of Classification Search ................. 257/499, 257/544
See application file for complete search history.

(56) References Cited

FOREIGN PATENT DOCUMENTS

JP 2003-78009 A 3/2003

*Primary Examiner*—Evan Pert
(74) *Attorney, Agent, or Firm*—Miles & Stockbridge P.C.

(57) ABSTRACT

Repeaters are arranged at arbitrary positions to substantially improve transmission speed of a signal. In the semiconductor integrated circuit device 1, repeater regions 10 where repeaters are provided as relay points for wiring are provided in the central parts of the core power source regions 2, 3 and 5, on the left side of the core power source regions 4 to 8 and at the upper and lower parts of the semiconductor integrated circuit device 1. A power switch region for repeater 11 is formed so as to surround the core power source regions 2 to 8 and the repeater regions 10. The power source lines of the reference potential connected to the repeater regions 10 are laid out at equally spaced intervals throughout the core power source regions 2 to 8, which enables the repeater regions 10 to be flexibly laid out. This permits the repeaters to be more effectively arranged, which improves the performances of semiconductor integrated circuit device 1.

18 Claims, 7 Drawing Sheets

SEMICONDUCTOR INTEGRATED CIRCUIT DEVICE

BACKGROUND OF THE INVENTION

The present invention relates to a technique to sophisticate a semiconductor integrated circuit device, and in particular, to a technique effective for improvement in transmission speed in a semiconductor integrated circuit device including power source regions supplied with a plurality of power source voltages.

Of late years cellular phones have been popularized as one of means of mobile communications, of which functions have required to be diverse. For example, there are very strong demands for low power consuming semiconductor integrated circuit devices used in cellular phones.

It has been known that low power consumption techniques used in semiconductor integrated circuit devices include one in which, for example, core power source regions supplied with different voltage levels are divided and power is ON/OFF controlled for each divided region.

A power switch is provided for each core power source region. The power switches are provided so as to surround the core power source regions and are connected between each core power source region and reference potential VSS.

The power switch connects an arbitrary core power source region to reference potential VSS and disconnects an arbitrary core power source region from reference potential VSS on the basis of a control signal to turn on/off power supply.

When signals are transmitted to or received from different core power source regions, a repeating buffer, so-called repeater is provided to repeat wires long in length, preventing electrical signal characteristics from being deteriorated.

Power source technique of this type in a repeating buffer for repeating signals between core power source regions includes one in which, for example, another power except for power supplied for a buffer-inserted block is supplied for the signal repeating buffer to realize power control for each layout block while securing power supply to an inter-block signal repeating buffer (refer to Patent Document 1).

(Patent Document 1): Japanese Unexamined Patent Publication No. 2003-78009

SUMMARY OF THE INVENTION

The present inventors have found that a signal transmission technique based on a repeater inserted between core power source regions and a layout technique based on the power switch described above have the following problems.

A repeater is generally arranged in a power source region on the output side in one arbitrary core power source region. In this case, fragmentation of the core power source region elongates wires wired to different core power source regions.

This deteriorates electrical characteristics of a signal and lowers resistance to Electro-Magnetic (EM) as well, which may impair reliability in semiconductor integrated circuit devices.

As previously stated, the power switches are so provided as to surround the core power source regions, and further fragmentation of the core power source regions increases layout area required for the power switches, which causes a problem in which semiconductor chip is increased in size.

The present invention has for its purpose to provide a technique in which a repeater is arranged in a position to enable substantially improving transmission speed of a signal.

The above and further objects and novel features of the present invention will be apparent from the description of the present specification and the accompanying drawings.

The following is a description of outline of typical inventions out of disclosed ones in the present application.

The present invention provides a semiconductor integrated circuit device provided with a plurality of power source regions for which the supply of a power source voltage is separately controlled and in which one or more functional modules are arranged. The semiconductor integrated circuit device comprises a power supplying section which controls power supply to the power source regions, a repeater region including a repeater which transmits signals to and receives signals from an arbitrary power source region and a repeater power supply switching section which controls power supply to the repeater region based on a control signal. The repeater region is arranged in an arbitrary power source region, and the repeater power supply switching section is arranged at the periphery of two opposing sides in a semiconductor chip on which a plurality of the power supply regions are formed.

The outlines of the other inventions of the present application will be briefly described below.

In the present invention, the repeater region is surrounded in its periphery by WELL separation.

Furthermore, in the present invention, the power supplying section comprises a switch controlling section which outputs a control signal based on a power supply requesting signal, and a power switching section which is connected between the power source region and reference potential and performs switching based on the control signal outputted from the switch controlling section to control the supply of power source voltage in the power source region, wherein a control signal line which transmits the control signal outputted from the switch controlling section to the power switching section is wired so as to be far away from the annularly formed power-source-ring wiring which supplies power to the power source region.

Furthermore, in the present invention, the power source region is formed over a Deep N-WELL.

Furthermore, in the present invention, the power source region is repetitively laid out in such a manner that P-WELLs are interposed between N-WELLs.

Still furthermore, in the present invention, the N-WELLs are arranged in a straight line when the power source regions are laid out in the semiconductor chip.

The following is a description of outline of typical inventions out of disclosed ones in the present application.

(1) Overhead area in the semiconductor integrated circuit device can be decreased.

(2) Furthermore, resistance to the performances of the Electro-Magnetic Compatibility (EMC) in the semiconductor integrated circuit device can be improved.

(3) Still furthermore, the repeater is enabled to be more effectively arranged, which improves the performance of the semiconductor integrated circuit device.

DETAILED DESCRIPTION OF THE PREFERRED EMBODIMENTS

Figure 1:
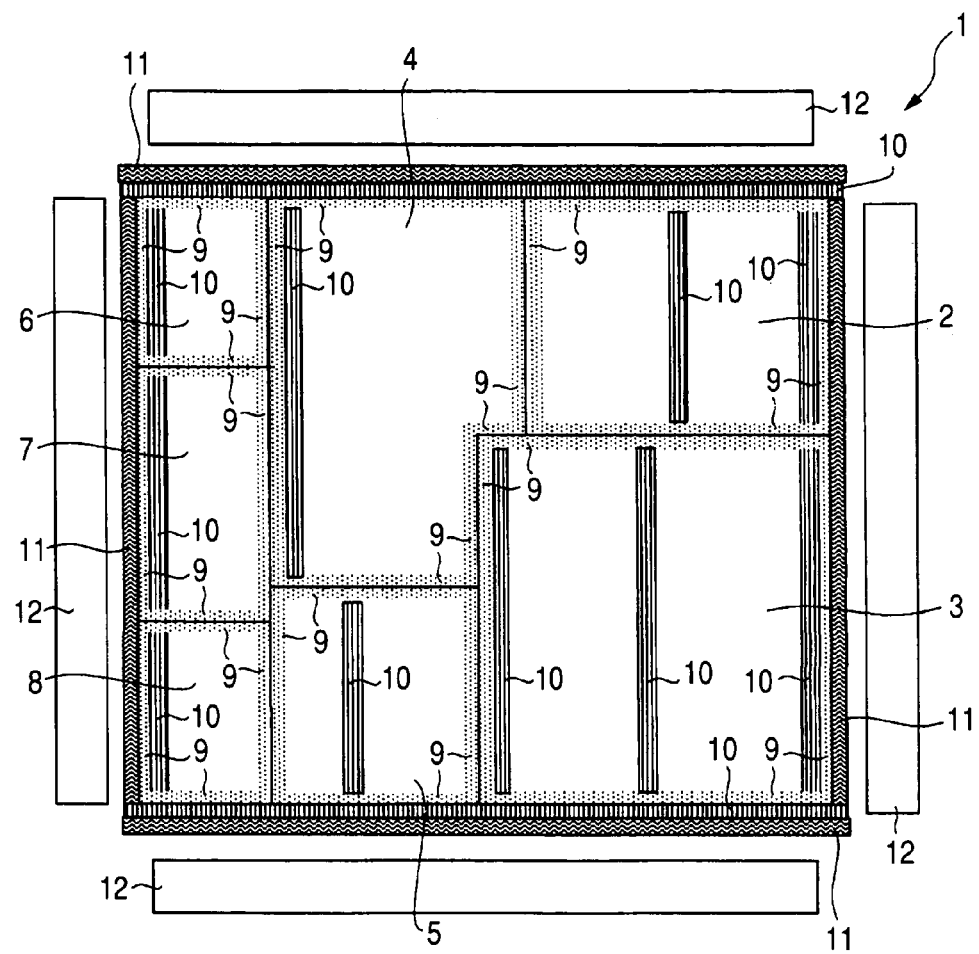
FIG. 1 is an explanatory drawing showing power supply regions in a semiconductor integrated circuit device according to one embodiment of the present invention.

The embodiment of the present invention is described in detail below based on the drawings. In all the figures for describing the embodiment, the same reference numerals and characters are given the same members in principle to omit duplicate description thereof.

Figure 2:
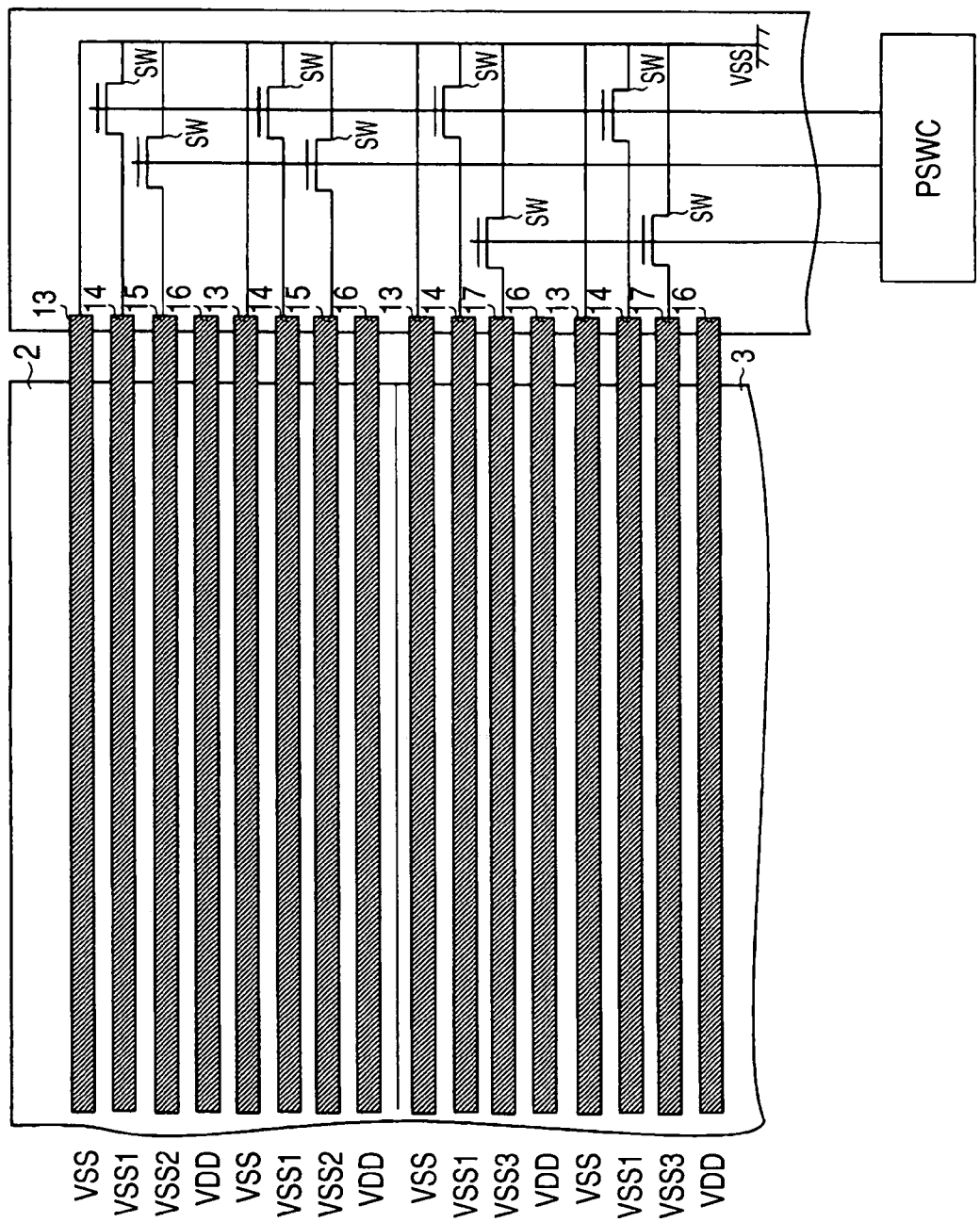
FIG. 2 is an explanatory drawing showing an example of layout for power source lines in the semiconductor integrated circuit device in FIG. 1.
Figure 3:
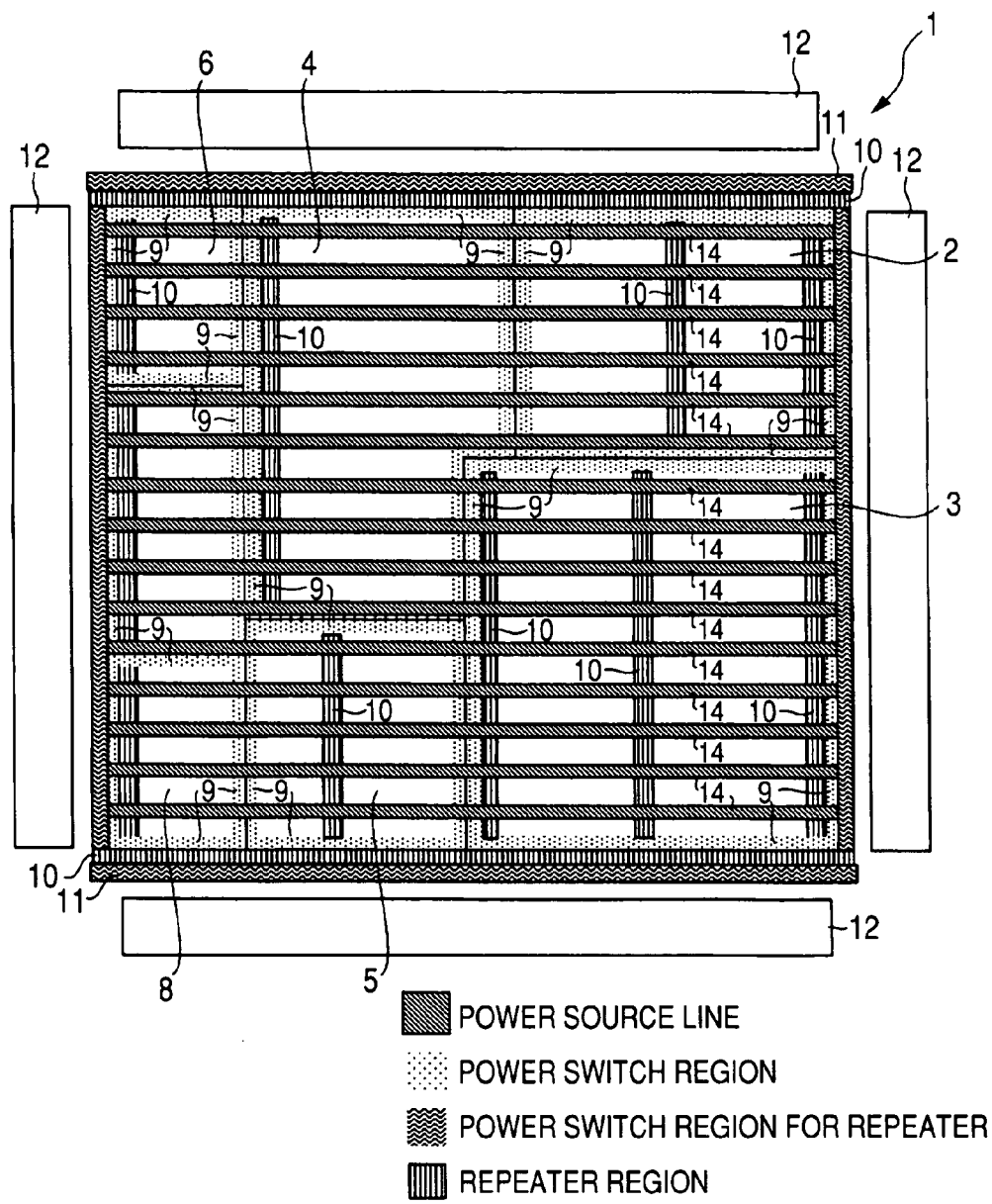
FIG. 3 is an explanatory drawing showing one example of layout in power source lines of reference potential VSS connected to a repeater region provided on the semiconductor integrated circuit device in FIG. 1.
Figure 4:
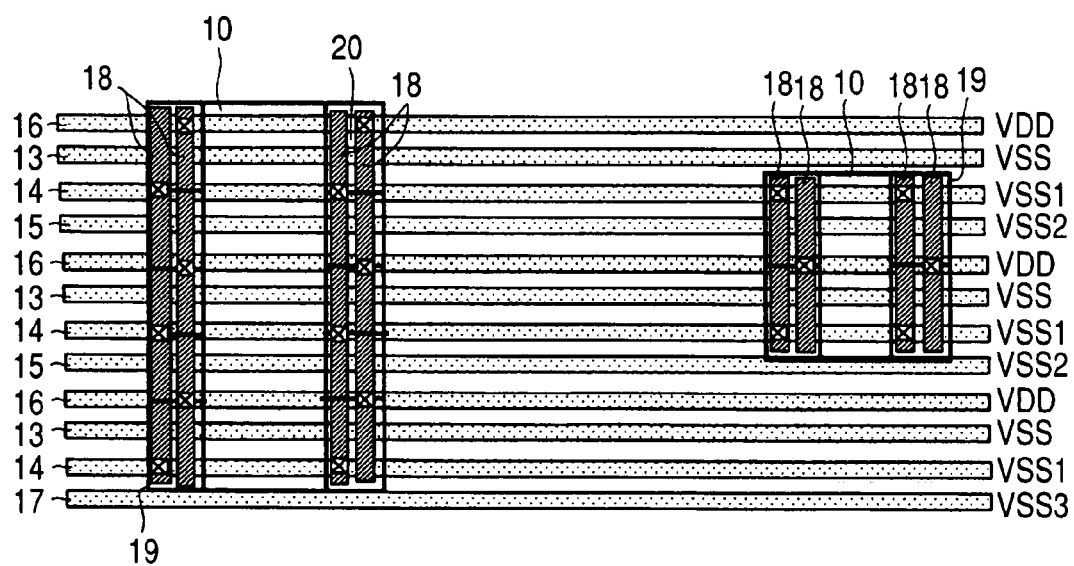
FIG. 4 is an explanatory drawing on how to supply power to the repeater region in the power source line in FIG. 3.
Figure 5:
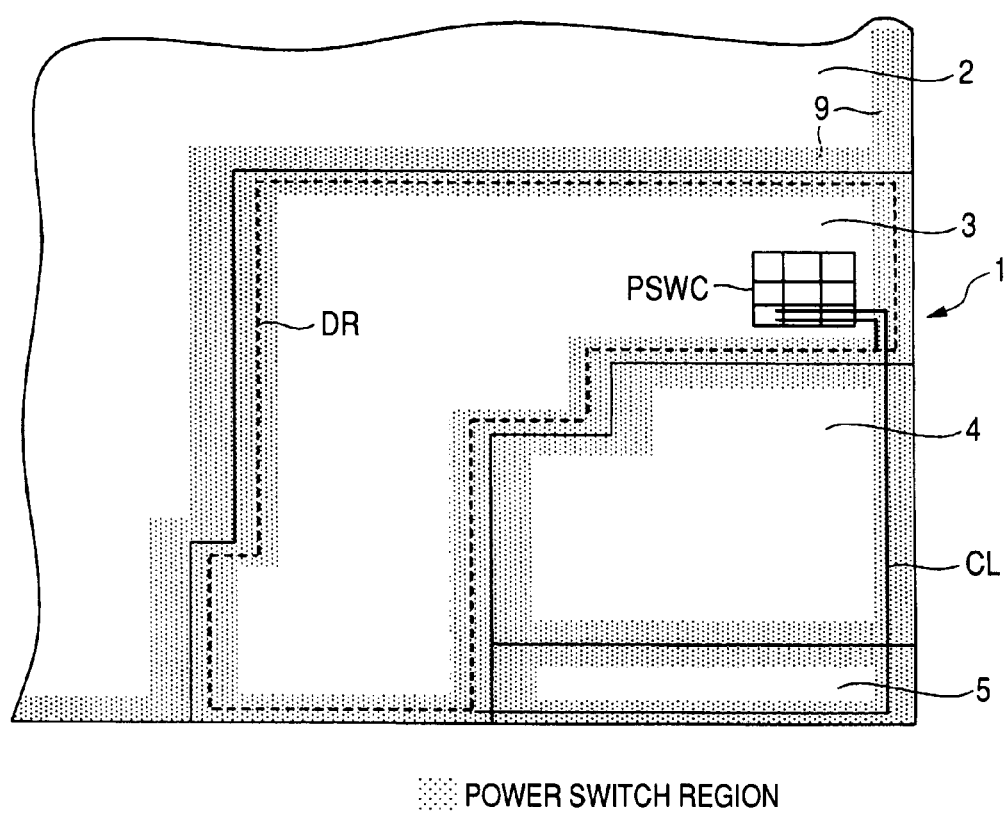
FIG. 5 is an explanatory drawing showing example of wiring for a control signal line in a power switch region provided on the semiconductor integrated circuit device in FIG. 1.
Figure 6:
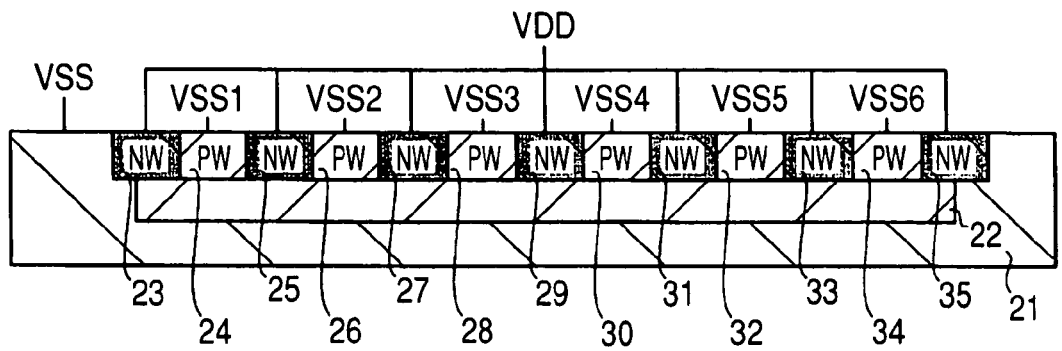
FIG. 6 is a cross section of a semiconductor chip illustrating power source isolation structure in the semiconductor integrated circuit device in FIG. 1.
Figure 7:
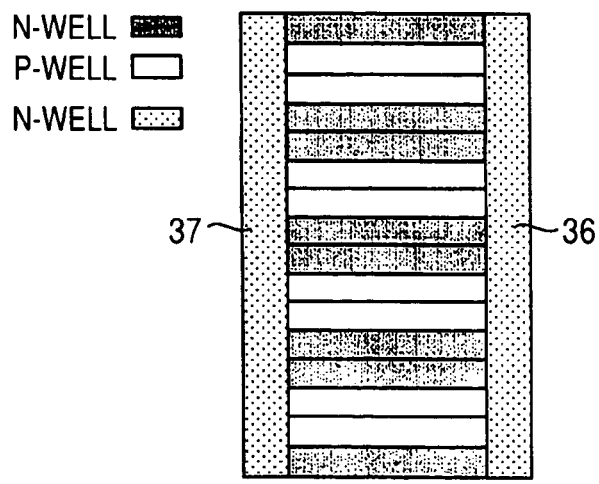
FIG. 7 is an explanatory drawing showing plane layout of power source isolation structure in power source region formed in the semiconductor chip shown in FIG. 6.
Figure 8:
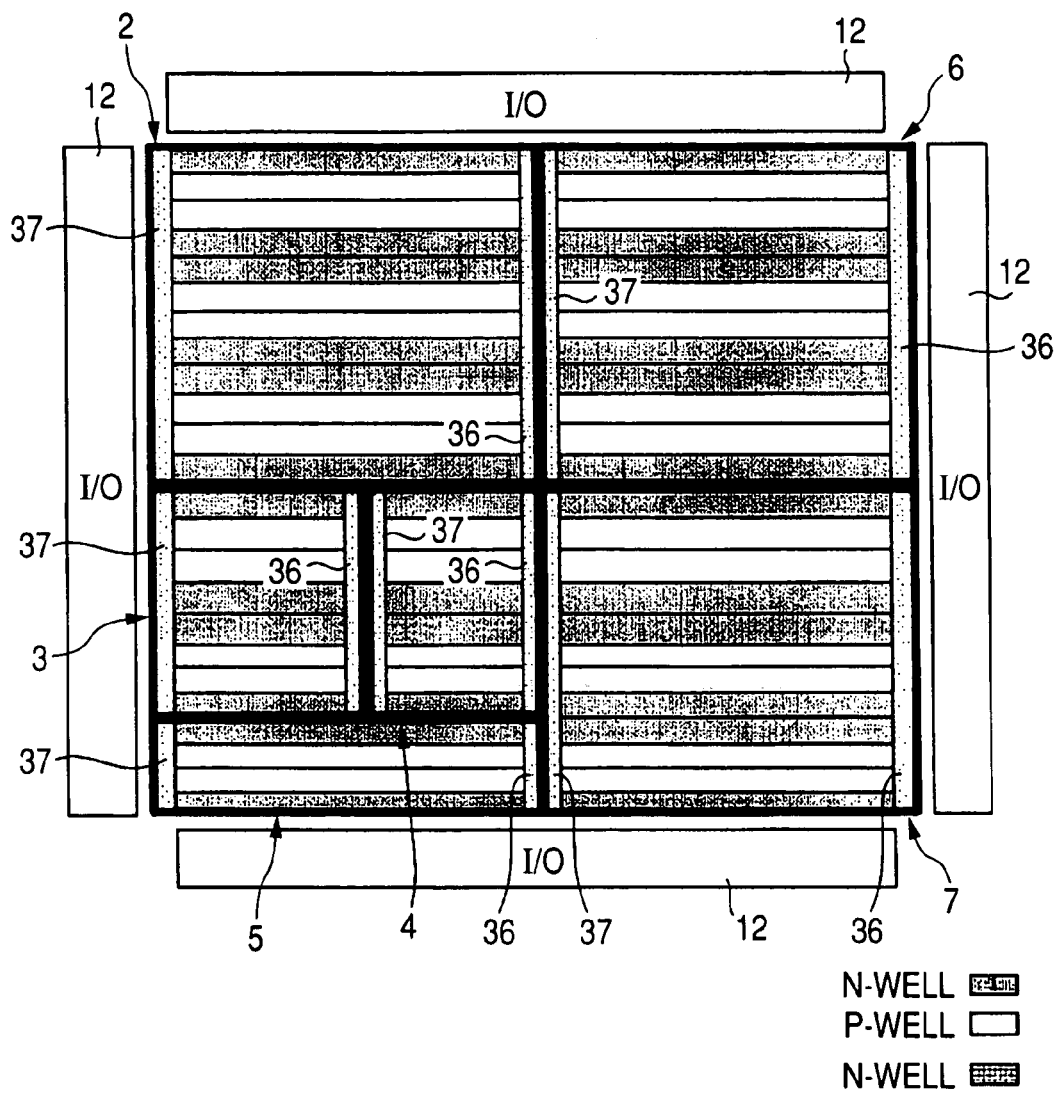
FIG. 8 is an explanatory drawing showing one example in cases where core power source region is formed by layout in power source region shown in FIG. 7.

FIG. 1 is an explanatory drawing showing power supply regions in a semiconductor integrated circuit device according to one embodiment of the present invention. FIG. 2 is an explanatory drawing showing an example of layout for power source lines in the semiconductor integrated circuit device in FIG. 1. FIG. 3 is an explanatory drawing showing one example of layout in power source lines of reference potential VSS connected to a repeater region provided on the semiconductor integrated circuit device in FIG. 1. FIG. 4 is an explanatory drawing on how to supply power to the repeater region in the power source line in FIG. 3. FIG. 5 is an explanatory drawing showing example of wiring for a control signal line in a power switch region provided on the semiconductor integrated circuit device in FIG. 1. FIG. 6 is a cross section of a semiconductor chip illustrating power source isolation structure in the semiconductor integrated circuit device in FIG. 1. FIG. 7 is an explanatory drawing showing plane layout of power source isolation structure in power source region formed in the semiconductor chip shown in FIG. 6. FIG. 8 is an explanatory drawing showing one example in cases where core power source region is formed by layout in power source region shown in FIG. 7.

In the present embodiment, a semiconductor integrated circuit device 1 is used in, for example, an electronic system such as cellular phones. FIG. 1 is an explanatory drawing illustrating the structure of power supply regions in the semiconductor integrated circuit device 1.

As shown in the figure, in the semiconductor integrated circuit device 1, core power source regions (power source regions) 2 to 8 are functionally divided. With a part of core power source regions (for example, the core power source region 8) not supplied with power (cut-off), power is supplied to the other core power source regions (for example, the core power source regions 2 to 7), which allows normal operation in the core power source regions.

Power switch regions (power supplying section) 9 are provided around the core power source regions 2 to 8 respectively. Power switch regions 9 are provided with power switches (power switching section).

The power switches are connected between the core power source regions 2 to 8 and a reference potential VSS. The power switch connects an arbitrary core power source region to reference potential VSS and disconnects an arbitrary core power source region from reference potential VSS on the basis of a control signal to turn on/off power supply.

In addition, the repeater regions 10 are provided in the central parts of the core power source regions 2, 3 and 5, on the left side of the core power source regions 4 to 8 and at the upper and lower parts of the semiconductor integrated circuit device 1 respectively. The repeater region 10 is an area where a repeater functioning as a relay point for a longer wire is provided.

A power switch region for a repeater (a repeater power-source switch section) 11 is so formed as to surround the core power source regions 2 to 8 and the repeater region 10. The power switches connected between the repeaters 10 and reference potential VSS are provided in the power switch regions for repeaters 11.

The power switch connects the repeater region 10 to reference potential VSS and disconnects the repeater region 10 from reference potential VSS on the basis of a control signal to turn on/off power supply. Input/Output (I/O) regions 12 are formed at the outside of each repeater region 10.

FIG. 2 is a partially enlarged explanatory drawing showing an example of wiring layout for power source lines 13 to 17 in the semiconductor integrated circuit device 1. FIG. 3 is an explanatory drawing showing one example of layout in the power source line 14 of reference potential VSS connected to the repeater region 10.

As shown in FIG. 2, the power source lines 13 to 16 are repeatedly wired from the upper to the lower part in the core power source region 2 of the semiconductor integrated circuit device 1. In addition, the power source lines 13, 14, 17 and 16 are repeatedly wired from the upper to the lower part in the core power source region 3 positioned under the core power source region 2. The power source lines are laid out all over the core power source regions 2 to 8.

The power source line 13 is for the reference potential VSS. The power source line 14 is for the reference potential VSS1 in the repeater region 10 and connected to the power source line 13 through the power switch SW in the power switch region for the repeater 11.

The power source line 15 is for the reference potential VSS2 in the core power source region 2, the power source line 16 is for the reference potential VSS3 in the core power source region 3 and the power source lines 15 and 16 are connected to the power source line 13 through the power switch SW of the power switch region 9. The power source line 16 is for supplying power source voltage VDD.

The switch SW is turned on/off by, for example, a switch controlling section PSWC connected to a system controller provided on the semiconductor integrated circuit device 1.

For this reason, as shown in FIG. 3, the power source line 14 is laid out at equally spaced intervals throughout the core power source regions 2 to 8 at a rate of one out of four power source lines, which enables the repeater region 10 to be flexibly laid out.

Thus laying out the power source lines 14 permits the repeater regions 10 to be supplied with sufficient power, which improves resistance to Electrostatic Discharge (ESD).

FIG. 4 is an explanatory drawing on how to supply power to the repeater region 10 in the power source line 14.

The power source lines 13 to 17 are formed on, for example, the uppermost wiring layer. Wires 18 formed in the lower wiring layer orthogonal to the power source lines 13 to 17 are connected to the power source lines 14 and 16 through vias 19. Power is supplied to the repeater regions 10 through the wires 18 connected to the power source lines 14 and 16.

In addition, the repeater regions 10 are surrounded by separated cells 20 which are regions where periphery of the repeater regions 10 is WELL-separated (including wirings on WELL separation and vias) and supplied with power through the separated cells 20. The separated cells 20 include protective elements for preventing ESD.

FIG. 5 is an explanatory drawing showing example of wiring for a control signal line in the power switch region 9 of the core power source region 3.

The switch controlling section PSWC which controls ON/OFF operation of the power switch region 9 is provided in the core power source region 3. The control signal outputted from the switch control section PSWC is inputted into the switch of the power switch region 9 through the control signal line CL.

A power source ring DR in which wires of the reference potential VSS3 and the power source voltage VDD are annularly wired is formed in the core power source region 3. As shown in FIG. 5, the control signal line CL is wired so as to be far away from the power source ring DR (for example, by way of the core power source regions 4 and 5).

This allows the power switch region 9 to perform switching operation without being adversely affected by noise carried on the power source lines, which improves reliability of the semiconductor integrated circuit device 1.

FIG. 6 is a cross section of a semiconductor chip showing a power source isolation structure in the semiconductor integrated circuit device 1. FIG. 6 shows one example in cases where the core power source regions 2 to 7 are arranged in a straight line for simplification.

As shown in the figure, the power source isolation structure is such that an element isolation region (Deep N-WELL) 22 is formed on a p-type semiconductor substrate (semiconductor chip) 21.

On the element isolation region 22 are formed N-WELL 23, P-WELL 24, N-WELL 25, P-WELL 26, N-WELL 27, P-WELL 28, N-WELL 29, P-WELL 30, N-WELL 31, P-WELL 32, N-WELL 33, P-WELL 34 and N-WELL 35 from left to right.

N-WELLs 23, 25, 27, 29, 31, 33, and 35 are power source regions to which the power source voltage VDD is supplied. P-WELL 24 is a power source region to which the reference potential VSS1 of the repeater region 10 is connected and P-WELL 26 is a power source region to which the reference potential VSS2 of the core power source region 2 is connected.

P-WELL 28 is a power source region to which the reference potential VSS3 of the core power source region 3 is connected. P-WELL 30 is a power source region to which the reference potential VSS4 of the core power source region 4 is connected.

P-WELL 32 is a power source region to which the reference potential VSS5 of the core power source region 5 is connected. P-WELL 34 is a power source region to which the reference potential VSS6 of the core power source region 6 is connected.

FIG. 7 is an explanatory drawing showing an arbitrary power source region formed in the semiconductor chip. FIG. 7 shows plane layout of the power source isolation structure in core power source regions 2 to 5 in FIG. 6.

As shown in the figure, P-WELLs where the reference potential VSS1 of the repeater region 10 and the reference potentials VSS2 to VSS4 of the core power source regions 2 to 4 are connected are laid out to be interposed between N-WELLs to which the power source voltage VDD is supplied.

Thus, laying out the power source isolation structure in such a manner that P-WELLs are interposed between N-WELLS and laying out new patterns of N-WELLs 36 and 37 on the left and right in the figure can simply realize a multiple power source isolation structure, reducing a layout area.

FIG. 8 is an explanatory drawing showing one example in cases where the core power source regions 2 to 7 are formed based on the layout of the power source regions shown in FIG. 7

As shown in the figure, the power source regions of P-WELLs are interposed by those of N-WELLs and all power source regions are regularly formed, thereby allowing the power source regions supplying power to N-WELLs to be formed on a straight line in the same direction, which prevents power source patterns in the power source regions from complicatedly being routed.

According to the present embodiment, this enables reducing an overhead area in the semiconductor integrated circuit device 1 and improving resistance to EMC performance in the semiconductor integrated circuit device 1.

Furthermore, the repeater region 10 can be optionally arranged to allow repeaters to be efficiently arranged, improving the performance of the semiconductor integrated circuit device 1.

Although the invention made by the inventors have been described in details based upon the embodiments, it is not limited to the above embodiments. It is to be understood that various modifications may be made without departing from the gist of the invention.

The present invention is suited for a technique for optimally arranging repeaters in a semiconductor integrated circuit device provided with a plurality of power source regions for which the supply of a power source voltage is separately controlled.

What is claimed is:

1. A semiconductor integrated circuit device provided with a plurality of power source regions for which the supply of a power source voltage is separately controlled and in which one or more functional modules are arranged, the semiconductor integrated circuit device comprising:

a power supplying section which controls power supply to the power source regions;

a repeater region including a repeater which transmits signals to and receives signals from an arbitrary power source region; and a repeater power supply switching section which controls power supply to the repeater region based on a control signal;

wherein the repeater region is arranged in an arbitrary power source region, and the repeater power supply switching section is arranged at the periphery of two opposing sides in a semiconductor chip on which the power supply regions are formed.

2. The semiconductor integrated circuit device according to claim 1, wherein the repeater region is surrounded in its periphery by WELL separation.

3. The semiconductor integrated circuit device according to claim 1, wherein the power supplying section comprises a switch controlling section which outputs a control signal based on a power supply requesting signal, and a power switching section which is connected between the power source region and reference potential and performs switching based on the control signal outputted from the switch controlling section to control the supply of power source voltage in the power source region, and wherein a control signal line which transmits the control signal outputted from the switch controlling section to the power switching section is wired so as to be far away from the annularly formed power-source-ring wiring which supplies power to the power source region.

4. The semiconductor integrated circuit device according to claim 1, wherein the power source region is formed over a Deep N-WELL.

5. The semiconductor integrated circuit device according to claim 1, wherein the power source region is repetitively laid out in such a manner that P-WELLs are interposed between N-WELLs.

6. The semiconductor integrated circuit device according to claim 5, wherein the N-WELLs are arranged in a straight line when the power source regions are laid out in the semiconductor chip.

7. The semiconductor integrated circuit device according to claim 2,
wherein the power supplying section comprises
a switch controlling section which outputs a control signal based on a power supply requesting signal, and
a power switching section which is connected between the power source region and reference potential and performs switching based on the control signal outputted from the switch controlling section to control the supply of power source voltage in the power source region, and
wherein a control signal line which transmits the control signal outputted from the switch controlling section to the power switching section is wired so as to be far away from the annularly formed power-source-ring wiring which supplies power to the power source region.

8. The semiconductor integrated circuit device according to claim 7, wherein the power source region is formed over a Deep N-WELL.

9. The semiconductor integrated circuit device according to claim 8, wherein the power source region is repetitively laid out in such a manner that P-WELLs are interposed between N-WELLs.

10. The semiconductor integrated circuit device according to claim 9, wherein the N-WELLs are arranged in a straight line when the power source regions are laid out in the semiconductor chip.

11. The semiconductor integrated circuit device according to claim 2, wherein the power source region is formed over a Deep N-WELL.

12. The semiconductor integrated circuit device according to claim 2, wherein the power source region is repetitively laid out in such a manner that P-WELLs are interposed between N-WELLs.

13. The semiconductor integrated circuit device according to claim 12, wherein the N-WELLs are arranged in a straight line when the power source regions are laid out in the semiconductor chip.

14. The semiconductor integrated circuit device according to claim 3, wherein the power source region is formed over a Deep N-WELL.

15. The semiconductor integrated circuit device according to claim 3, wherein the power source region is repetitively laid out in such a manner that P-WELLs are interposed between N-WELLs.

16. The semiconductor integrated circuit device according to claim 15, wherein the N-WELLs are arranged in a straight line when the power source regions are laid out in the semiconductor chip.

17. The semiconductor integrated circuit device according to claim 4, wherein the power source region is repetitively laid out in such a manner that P-WELLs are interposed between N-WELLs.

18. The semiconductor integrated circuit device according to claim 17, wherein the N-WELLs are arranged in a straight line when-the power source regions are laid out in the semiconductor chip.

* * * * *